United States Patent [19]

Fetty

[11] Patent Number: 4,673,443
[45] Date of Patent: Jun. 16, 1987

[54] CONTINUOUS IONIZER FOR SEMICONDUCTOR MANUFACTURING PROCESSES

[75] Inventor: Allan M. Fetty, Austin, Tex.

[73] Assignee: Motorola, Inc., Schaumburg, Ill.

[21] Appl. No.: 713,158

[22] Filed: Mar. 18, 1985

[51] Int. Cl.$^4$ .......................... B08B 1/00; B08B 7/04; B01D 47/02; B01D 47/100

[52] U.S. Cl. .................................... 134/25.4; 134/18; 261/123; 261/DIG. 7; 261/64 D; 261/64.5

[58] Field of Search .............................. 134/18, 25.4; 261/DIG. 7, 123

[56] References Cited

U.S. PATENT DOCUMENTS

| | | | |
|---|---|---|---|
| 659,657 | 10/1900 | Felter | 261/DIG. 7 X |
| 867,356 | 10/1907 | Fox | 261/DIG. 7 X |
| 2,326,243 | 8/1943 | Meyer | 261/DIG. 7 X |
| 3,083,148 | 3/1963 | Mojonnier | 261/123 X |
| 3,213,016 | 10/1965 | Gowers et al. | 210/24 |
| 3,378,339 | 4/1968 | Yamashiki | 23/100 |
| 3,475,330 | 10/1969 | Gilles | 210/25 |
| 3,490,249 | 1/1970 | Schwertfeger et al. | 261/DIG. 7 |
| 3,701,793 | 10/1972 | Schmidt et al. | 261/123 X |
| 3,764,014 | 10/1973 | Stern et al. | 261/123 X |
| 4,219,414 | 8/1980 | Crits | 210/27 |
| 4,329,234 | 5/1982 | Cikut et al. | 261/123 X |

FOREIGN PATENT DOCUMENTS

| | | | |
|---|---|---|---|
| 1517502 | 12/1966 | Fed. Rep. of Germany | 261/DIG. 7 |
| 6025586 | 7/1983 | Japan | 261/DIG. 7 |

*Primary Examiner*—John Doll
*Assistant Examiner*—William G. Wright
*Attorney, Agent, or Firm*—John A. Fisher; Jeffrey Van Myers; David L. Mossman

[57] ABSTRACT

A continuous ionizer adapted to introduce selected ions into a continually flowing stream of liquid. To ensure that a maximum concentration of ions is incorporated, the continuous ionizer is configured so that turbulent and intimate mixing of the ionizing gas and liquid to be ionized occurs. The flow of ionizing gas is regulated by a liquid level sensor to prevent a gas/liquid mixture from proceeding downstream from the ionizer. The apparatus and method of this invention are particularly suited to situations where deionized water is used in a process which causes undesired static electricity discharges, and clean, ion-possessing water is preferred, such as semiconductor processing.

10 Claims, 3 Drawing Figures

CONTINUOUS IONIZER FOR SEMICONDUCTOR MANUFACTURING PROCESSES

Technical Field

This invention relates generally to apparatus and methods for introducing ions into liquids and, more particularly, to ionization apparatus and methods designed to introduce ions into a continuously flowing stream of liquid used in cleaning chrome-plated semiconductor masks.

BACKGROUND ART

Various techniques for removing ions from liquid streams, particularly water, have long been known in the art. For example, various filters, such as those using charcoal and ion exchange resins have been used to remove, and in some cases exchange, ions along with extraneous minerals.

For example, U.S. Pat. No. 3,213,016 to Gowers et al discloses an apparatus and technique for removing cations and/or anions from liquids, such as water, by passing the liquid containing the ions to be exchanged through a network of ion exchange resin fibers. Techniques also exist for replacing the ion exchange resin granules in a purification system that does not involve opening up the reactor, as in U.S. Pat. No. 3,378,339 to Yamashiki. One drawback to using ion exchange resins is that they must be rejuvenated periodically. Charcoal absorbers must generally be replaced entirely. U.S. Pat. No. 4,219,414 to Crits also presents an apparatus and technique for cleaning out portions of spent ion exchange means from a reactor in use. A multi-step process for exchanging ammonia and ammonium ions with the hydrogen ions of an ion exchange media is revealed in U.S. Pat. No. 3,475,330 to Gilles.

Extremely clean, deionized (DI) water is used by industry in many applications. For example, in the semiconductor industry, DI water is used for many cleaning functions such as in the high pressure jet scrubbing of semiconductor masks. However, it has been discovered that if completely deionized water is pressurized and pumped through a nozzle to form a scrubbing jet stream, the high velocity of the DI water moving through the air will strip electrons from the surrounding air molecules causing an arc to the nearest grounded surface. This phenomenon is known as the "Corona effect". Since the semiconductor mask being cleaned has chrome on its surface, the mask itself serves as the nearest available ground. Unfortunately, the high voltage arcing "burns" the chrome surface off the semiconductor mask at the area of contact rendering it useless.

As the above-described mask cleaning procedure is used industry-wide, this arcing problem is also well known. It is generally recognized that the solution is to reincorporate ions into the DI water to some extent. Using non-deionized water is an unacceptable answer because such water typically contains other mineral impurities which can damage the mask.

One technique for reintroducing ions into a DI water stream prior to the semiconductor mask scrubbing step was to employ an in-line magnesium ion exchanger. The exchanger was simply a section of pipe containing magnesium rods having their longitundial axes oriented parallel with the pipe. It was mounted in the DI water stream prior to the mask scrubber. In operation, the DI water would flow along the sides of the magnesium rods. The magnesium rods were found to be a major source of contamination both of particulates and residues (e.g. oily substances), however, particularly after the DI water was treated with peroxide to eliminate bacteria. Bacteria are also harmful to the semiconductor mask surfaces. The magnesium treatment has been replaced to some extent by a batch treatment reionizer. The batch reionizer is basically a container with a water-level sensor which allows water to flow into the container to a certain level before it shuts off. The container is pressurized with a gas, typically $CO_2$, which is absorbed by the water. The treated water remains stagnant in the container until it is used by the scrubbing equipment, which is followed by another filling and treatment cycle. While satisfactory reionized water is produced by this latter method, the batch characteristic which permits the water to remain stagnant for a time is undesirable because it permits bacteria to form while the water remains stagnant. Both of these ionization techniques have been known to be sold by Ultratech Corp.

Thus, the various apparatus and methods known to be available to introduce ions into water are unsatisfactory, particularly when used to solve the arcing problem associated with semiconductor mask scrubbing.

BRIEF SUMMARY OF THE INVENTION

Accordingly, an object of the present invention is to provide an improved apparatus and method for introducing ions into liquids.

Another object of the present invention is to provide an improved ionization apparatus and method which can be employed in-line to introduce ions into a stream of liquid without having to stop the liquid flow.

Another object of the present invention is to provide an improved ionization apparatus and method which will not introduce other unwanted contaminants into the treated liquid.

A further object of the invention is to provide an improved reionization apparatus and process wherein a mixture of reionization gas and liquid will not be permitted to exit the treatment apparatus.

Still another object of the invention is to provide an ionization technique where the ionizing media may be easily replenished.

Yet another object of the present invention is to provide an ionization technique that does not involve an ionization media that must periodically be removed from the ionizer and recharged.

In carrying out the above and other objects of the invention, there is provided, in one form, a continuous ionizer adapted for use in-line with a continuously flowing stream of liquid into which ions are to be introduced. The continuous ionizer is generally an enclosed container having at least one liquid inlet and at least one liquid outlet. Between the inlet and outlet are a plurality of flow baffles which create within the enclosing container a convoluted liquid pathway between the inlet and outlet. A gas inlet is provided near the liquid inlet to permit an ionizing gas to be bubbled through the liquid as it flows through the convoluted pathway which causes intimate mixing of the gas and liquid.

DETAILED DESCRIPTION OF THE INVENTION

Figure 1:
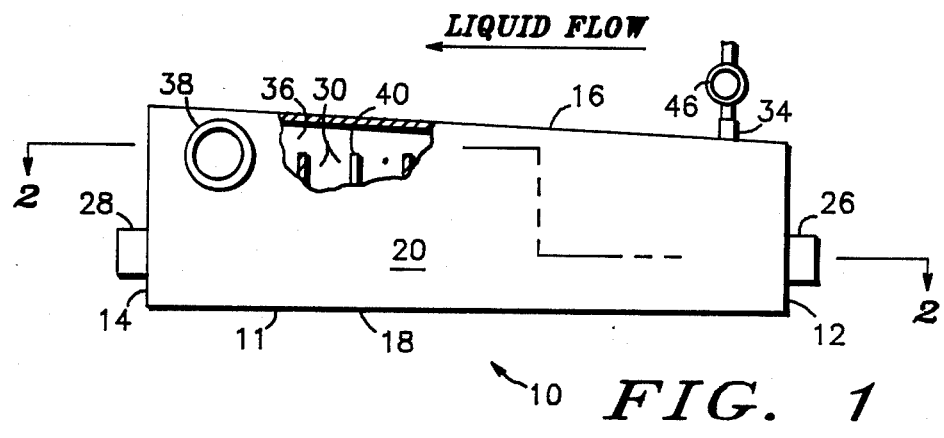
FIG. 1 illustrates a side elevational and partial section view of the continuous ionizer constructed in accordance with the preferred embodiment of the present invention.

Shown in FIG. 1 is a continuous ionizer 10 constructed in accordance with the present invention. Continuous ionizer 10 comprises, in the particular embodiment shown, front wall 12 and back wall 14 joined together via container top 16, container bottom 18 and side walls 20 and 22 to form an interior space 24. Front wall 12, back wall 14, top 16, bottom 18 and side walls 20 and 22 form the container 11 for the continuous ionizer 10. Although the particular embodiment of the invention shown in the drawings is of generally rectilinear, box-like appearance, it will be appreciated, as the invention is further described, that the exact shape is arbitrary and may be spherical, cylindrical, triangular, etc. and still serve as a satisfactory continuous ionizer.

The continuous ionizer 10 is provided with liquid inlet 26 and liquid outlet 28 spaced apart by some arbitrary distance. Within the enclosed interior space 24 of continuous ionizer 10 are a plurality of baffles 30 which create a convoluted liquid pathway 32 running from inlet 26 to outlet 28. It may be further appreciated by those skilled in the art that a convoluted liquid pathway 32 may be created in any number of ways besides the use of staggered or interdigitated flat baffles 30 depicted in the drawings. For example, a series of curved walls or even a convoluted pipe of complex configuration could be used to form the convoluted liquid pathway 32. The convoluted pathway 32 could even be designed to bend back on itself to give an ionizer design where the inlet 26 and outlet 28 are in the same wall. The particular elongated box embodiment of the drawings where inlet 26 and outlet 28 are on opposite ends of the ionizer is preferred only because it may be readily inserted into a conventional piping system. Liquid pathway 32 must be convoluted to break-up laminar liquid flow and to maximize the mixing of the ionizing gas and the liquid through turbulence. This same goal could also be accomplished by means of a pathway 32 extending from inlet 26 to outlet 28 filled with random arrangements of 0-rings or "saddles" commonly used in distillation towers.

The ionizing gas is introduced into the continuous ionizer 10 via gas introduction fitting 34, which should be positioned near liquid inlet 26 so that the gas contacts the liquid as soon as possible for maximum ionization effect. In a preferred embodiment, a plastic hose or tubing (not shown) may run from the gas introduction fitting 34 to the bottom of the ionizer 10 so that as the gas rises through the stream of liquid, as much gas/liquid contact occurs as possible.

It would be typical in continuous flow systems, particularly those where the flowing liquid is used in cleaning operations such as semiconductor mask scrubbing, for there to be a pump downstream from the continuous ionizer. Many conventional pumps cannot properly handle gas/liquid mixtures and cavitation results which will seriously damage the pump if permitted for any length of time. Thus, it is extremely important that no undissolved gas be permitted to leave liquid outlet 28 to reach the pump (not shown).

While it is theoretically possible to adjust the liquid flow rate through the continuous ionizer 10 and the gas flow rate through the gas introduction fitting 34 precisely enough that the incorporation of ions into the liquid from the gas/liquid interaction is at steady-state equilibrium, in actual practice this is difficult to achieve. Thus, an especially preferred embodiment of the continuous ionizer 10 provides an excess gas collection space 36 where the gas that does not immediately react with the liquid to form soluble ions collects. In the area where the excess gas collection space 36 begins, a liquid level sensor 42 equipped with liquid level probe 44 should be incorporated into the liquid level sensor fitting 38 at a predetermined liquid level 40. When enough gas is bubbled into the continuous ionizer 10 such that the liquid level drops below the predetermined liquid level 40, the sensor should switch off (or close) a gas flow control device 46 controlling the flow of gas through gas introduction fitting 32.

In operation, the liquid to be ionized enters the continuous ionizer 10 through liquid inlet 26 and flows through convoluted liquid pathway 32. The ionizing gas is bubbled through the flowing liquid via gas introduction fitting 34. The pressure of the gas being introduced must be greater than that of the liquid stream to prevent the liquid from backing through gas introduction fitting 34. As the liquid travels around the convoluted liquid pathway 32, causing turbulence and intimate mixing of the liquid and gas, any gas which is not immediately dissolved into the liquid to form ions rises and collects in excess gas collection space 36. Excess gas collection space 36 is formed by the upward incline of container top 16. The wedge-shaped area between the bottom of container top 16 and predetermined liquid level 40 forms the particular excess gas collection space 36. As may be readily understood, the exact shape and design of excess gas collection space 36 is arbitrary and depends on the particular configuration of the continuous ionizer 10 as a whole.

The excess gas collection phenomenon creates an interface between the excess gas and the flowing liquid, which provides further exposure of the liquid to the gas. In the specific embodiment depicted in the drawings, the surface area of this interface is equal to the cross-sectional area of the ionizer 10, i.e. equal to the area of container bottom 18. When enough gas is bubbled into the continuous ionizer 10 so that the excess gas collected expands beyond excess gas collection space 36 and predetermined liquid level 40, the liquid level sensor 42 will switch off or close the gas flow device 46 controlling the flow of gas into the ionizer 10. After the gas flow has been shut off for a time, the liquid level will rise above predetermined liquid level 40 and the liquid level sensor 42 will permit the gas control device to allow the ionizing gas to again flow into ionizer 10.

The exact nature of the liquid level sensor 42, the gas flow control device 46 and the communication between them is unimportant, so long as they perform the simple function just described. The gas flow control device 46 may be a solenoid controlled valve or other means and the liquid level sensor 42 may be a capacitance sensor, a mechanical float detector, a pressure-controlled sensor or a LED quartz liquid level detector, for example. The nature of the present invention should not be limited by these recitations which are merely illustrative.

It is anticipated that a number of liquids could be ionized using this technique. Further, a number of gases could also conceivably be used to advantage. What may be necessary is a match of the ions present in the liquid and those introduced by the gas. For example, water is known to contain associations of hydroxyl (OH⁻) and hydrogen (H⁺) ions. Thus, the introduction of ions into water to prevent arcing may somehow bind the ions already present to prevent the stripping of electrons from the neighboring air molecules. However, the exact mechanism of ion effect is not necessary for the operation, understanding or appreciation of the present invention. Routine experimentation will reveal the best gas/liquid match for a particular application. It may also be determined that certain gases introduce ions into liquids faster than others.

For the semiconductor mask scrubbing procedure previously described, it has been discovered that DI water is effectively ionized by the use of carbon dioxide ($CO_2$) as the ionizing gas. The intimate mixing of $CO_2$ and DI water forms a dilute solution of carbonic acid ($H_2CO_3$) present as associated ions in the water which prevents the stripping of electrons from the nearby air molecules and the subsequent arcing problem. This method for semiconductor mask scrubbing is particularly advantageous because the arcing to the thin chrome coating is eliminated, the $CO_2$ gas is cheap and plentiful, the DI water is not stagnant at any point (with the subsequent bacteria growth risk) and no other species or particulates harmful to the semiconductor mask are created.

Figure 2:
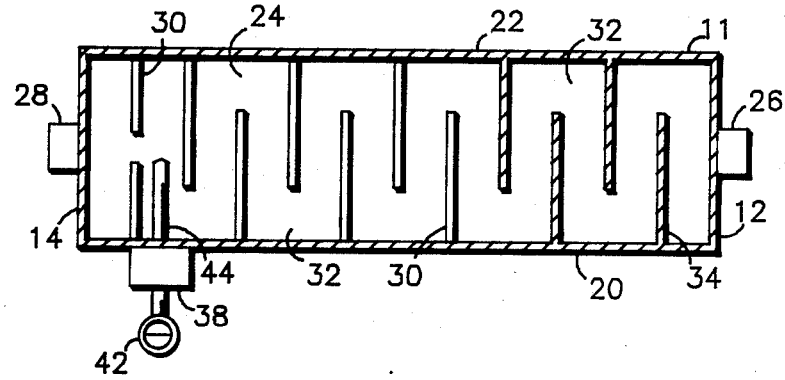
FIG. 2 illustrates a top cross-sectional view of the continuous ionizer according to this invention taken substantially on line 2—2 of FIG. 1.

Shown in FIG. 2 is a top sectional view of the continuous ionizer 10. As previously noted, the exact configuration of the plurality of baffles 30 and the resultant convoluted liquid pathway 32 is not critical except that their structure should create turbulence and intimate mixing of the liquid with the gas. A liquid level sensor 42 and accompanying liquid level probe 44 are schematically illustrated.

Figure 3:
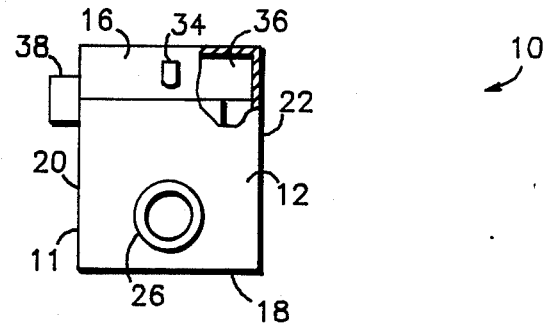
FIG. 3 illustrates a front elevational and partial section view of the continuous ionizer of this invention.

Shown in FIG. 3 is a front elevation and partial section view of the continuous ionizer 10 depicting another view of liquid inlet 26 and excess gas collection space 36 along with liquid level sensor fitting 38 and gas introduction fitting 34. The exact placement of these features is arbitrary so long as the ultimate desired results may be accomplished.

I claim:

1. An improved method for scrubbing a semiconductor mask having a metal pattern thereon with a stream of ionized liquid comprising spraying the liquid through air onto the mask, the improvements comprising introducing ions to a continuous stream of deionized liquid for use in scrubbing the semiconductor mask by passing a continuous stream of deionized liquid through a continuous ionizer wherein:

deionized liquid enters said ionizer through a liquid inlet;

the liquid subsequently travels along a convoluted liquid pathway;

an ionizing gas is bubbled through the liquid travelling along the convoluted liquid pathway to react with the liquid and form soluble ions; and the liquid containing soluble ions leaves the ionizer through a liquid outlet.

2. The method of claim 1 wherein the deionized liquid is deionized water.

3. The method of claim 1 wherein the ionizing gas is carbon dioxide.

4. The method of claim 1 wherein the deionized liquid is deionized water and the ionizing, gas is carbon dioxide.

5. The method of claim 1 wherein the flow of ionizing gas is regulated by a liquid level sensor which temporarily shuts off the ionizing gas flow when the liquid level falls below a predetermined liquid level.

6. An improved method for scrubbing semiconductor masks having a metal pattern thereon comprising the steps of:

removing the ions from a continuous stream of liquid to be used in scrubbing the masks; and spraying the liquid through air onto the mask; wherein the improvement comprises introducing selected ions into the continuous stream of deionized liquid by the steps of:

introducing the continuous stream of deionized liquid into a continuous ionizer through a liquid inlet;

continuously passing the liquid along a convoluted liquid pathway;

bubbling an ionizing gas is through the liquid passing along the convoluted liquid pathway to react with the liquid and dissolve selected soluble ions into the liquid; and allowing the liquid containing selected soluble ions to leave the ionizer through a liquid outlet to subsequently be sprayed through the air onto the semiconductor mask.

7. The improved method of claim 6 wherein the deionized liquid is deionized water.

8. The improved method of claim 6 wherein the ionizing gas is carbon monoxide.

9. The improved method of claim 6 wherein the deionized liquid is deionized water and the ionizing gas is carbon dioxide.

10. The improved method of claim 6 wherein the flow of ionizing gas is regulated by a liquid level sensor which temporarily shuts off the ionizing gas flow when the liquid level falls below a predetermined liquid level.

* * * * *